(12) United States Patent
Anderson et al.

(10) Patent No.: US 8,461,034 B2
(45) Date of Patent: Jun. 11, 2013

(54) LOCALIZED IMPLANT INTO ACTIVE REGION FOR ENHANCED STRESS

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 12/908,306

(22) Filed: Oct. 20, 2010

(65) Prior Publication Data
US 2012/0100685 A1 Apr. 26, 2012

(51) Int. Cl.
*H01L 21/22* (2006.01)

(52) U.S. Cl.
USPC .......................................................... 438/530

(58) Field of Classification Search
USPC ............. 438/510, 514, 530; 257/607, E21.35
See application file for complete search history.

(56) References Cited

U.S. PATENT DOCUMENTS

| | | | |
|---|---|---|---|
| 5,712,204 A * | 1/1998 | Horiuchi ........................ | 438/307 |
| 5,736,420 A * | 4/1998 | Min et al. ...................... | 438/143 |
| 6,251,760 B1 * | 6/2001 | Son ................................ | 438/585 |
| 6,352,872 B1 * | 3/2002 | Kim et al. ...................... | 438/24 |
| 6,709,935 B1 * | 3/2004 | Yu .................................. | 438/289 |
| 6,740,570 B2 * | 5/2004 | Chen et al. .................... | 438/528 |
| 6,849,527 B1 * | 2/2005 | Xiang ............................ | 438/528 |
| 6,977,408 B1 | 12/2005 | Lin et al. | |
| 7,214,972 B2 | 5/2007 | Hanafi et al. | |
| 7,220,630 B2 | 5/2007 | Cheng et al. | |
| 7,851,313 B1 * | 12/2010 | Luo et al. ...................... | 438/285 |
| 2002/0011603 A1 * | 1/2002 | Yagishita et al. ............. | 257/190 |
| 2005/0054182 A1 | 3/2005 | Wang | |
| 2005/0136583 A1 * | 6/2005 | Chen et al. .................... | 438/199 |
| 2007/0004114 A1 * | 1/2007 | Lee et al. ....................... | 438/197 |
| 2007/0018251 A1 * | 1/2007 | Hirase et al. .................. | 257/368 |
| 2007/0117296 A1 * | 5/2007 | Giles et al. .................... | 438/197 |
| 2007/0145430 A1 | 6/2007 | Sandhu et al. | |
| 2007/0148894 A1 * | 6/2007 | Orlowski et al. ............. | 438/370 |
| 2008/0048210 A1 * | 2/2008 | Shima ............................ | 257/192 |
| 2008/0135873 A1 | 6/2008 | Fiorenza et al. | |
| 2008/0296692 A1 * | 12/2008 | Griebenow et al. ........... | 257/368 |
| 2009/0098690 A1 * | 4/2009 | Yamazaki et al. ............. | 438/151 |
| 2010/0112766 A1 * | 5/2010 | Liu et al. ....................... | 438/232 |
| 2010/0164016 A1 * | 7/2010 | Kronholz et al. ............. | 257/402 |

OTHER PUBLICATIONS

Ohta, et al., "High Performance Sub-40 nm Bulk CMOS with Dopant Confinement Layer (DCL) technique as a Strain Booster", IEEE, 2007.
Yeh, et al., "Efficient Transistor Optimization with Stress Enhanced Notch-gate Technology for sub-90nm CMOSFET", IEEE, 2007.
Lin et al., "Extra bonus on transistor optimization with stress enhanced notched-gate technology for sub-90 nm complementary metal oxide semiconductor field effect transistor," Japanese Journal of Applied Physics, pp. 2131-2133, Part 1, vol. 46, No. 4B.

* cited by examiner

*Primary Examiner* — Jarrett Stark
*Assistant Examiner* — Michele Fan
(74) *Attorney, Agent, or Firm* — Hoffman Warnick LLC; Richard M. Kotulak

(57) ABSTRACT

Methods for enhancing strain in an integrated circuit are provided. Embodiments of the invention include using a localized implant into an active region prior to a gate etch. In another embodiment, source/drain regions adjacent to the gates are recessed to allow the strain to expand to full potential. New source/drain regions are allowed to grow back to maximize stress in the active region.

8 Claims, 6 Drawing Sheets

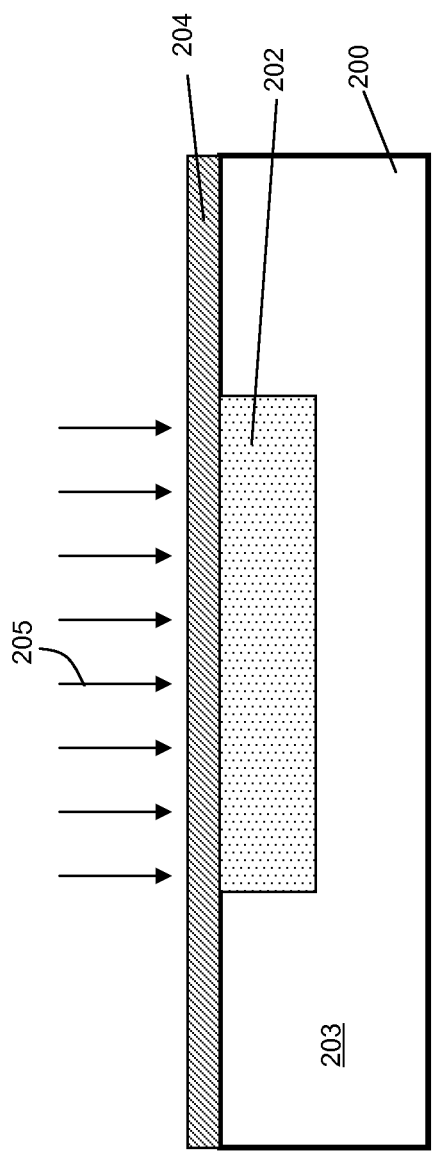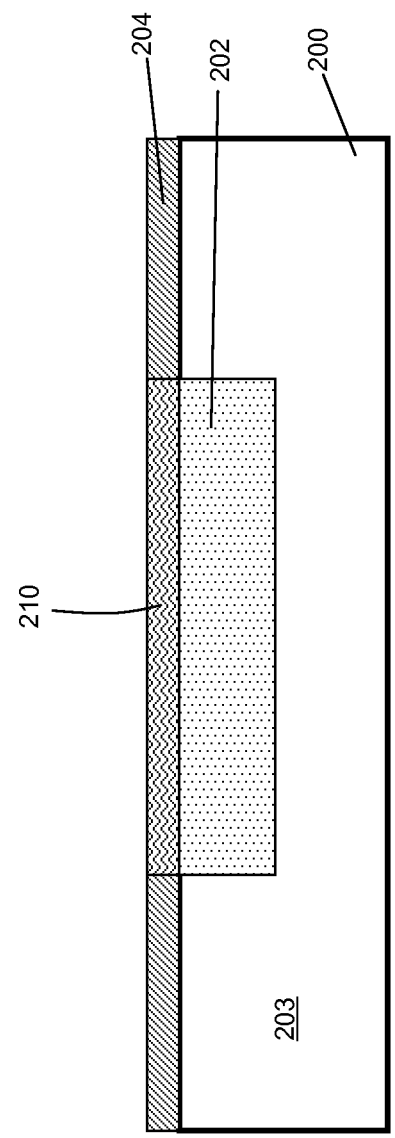

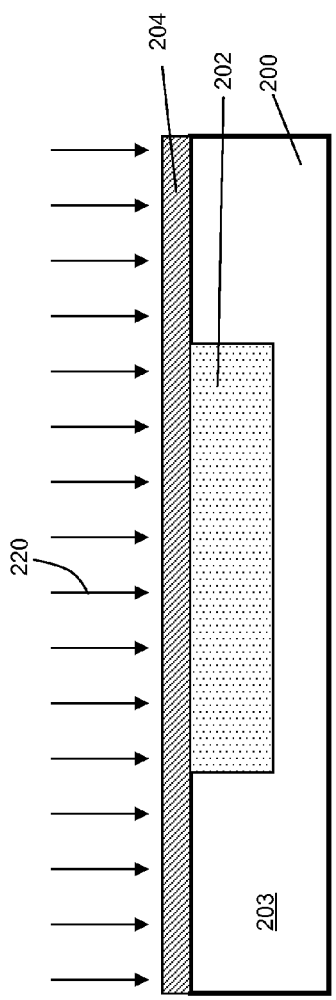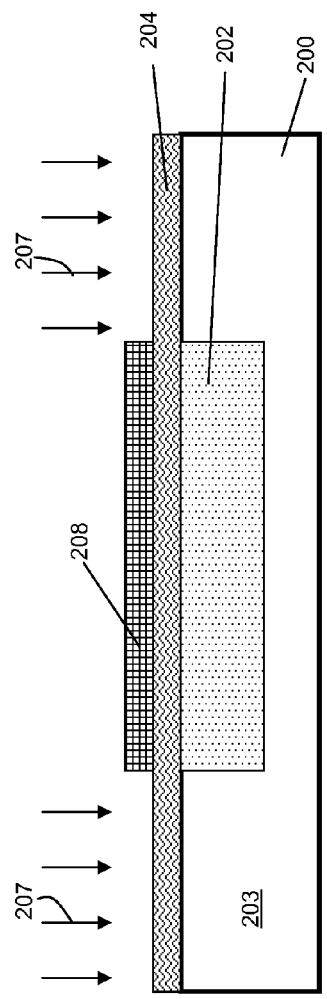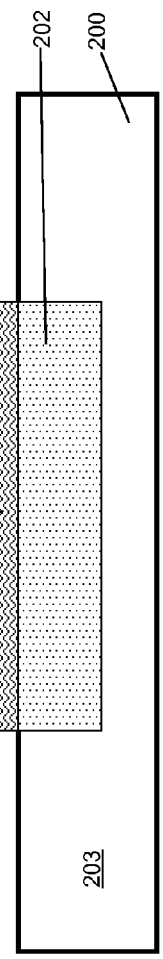

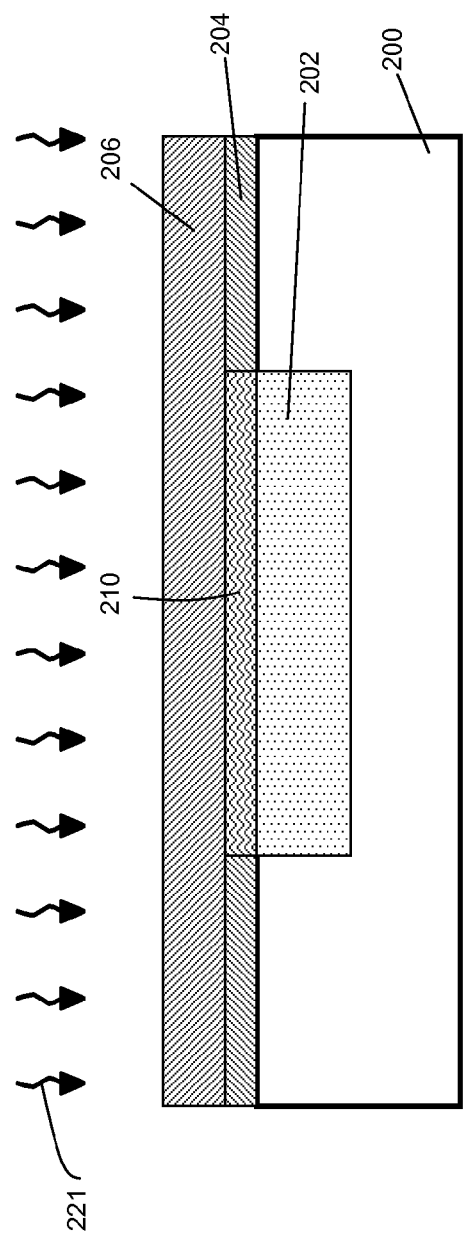
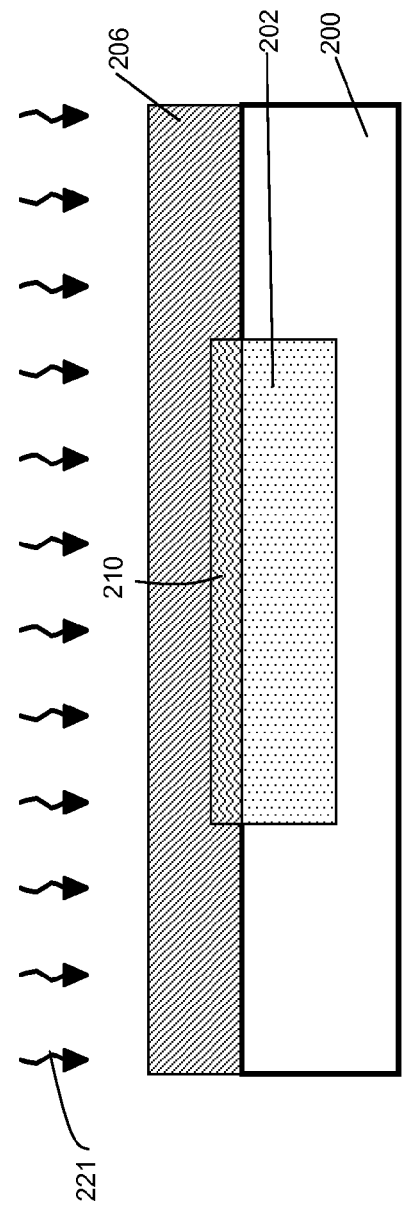
FIG. 9
FIG. 10

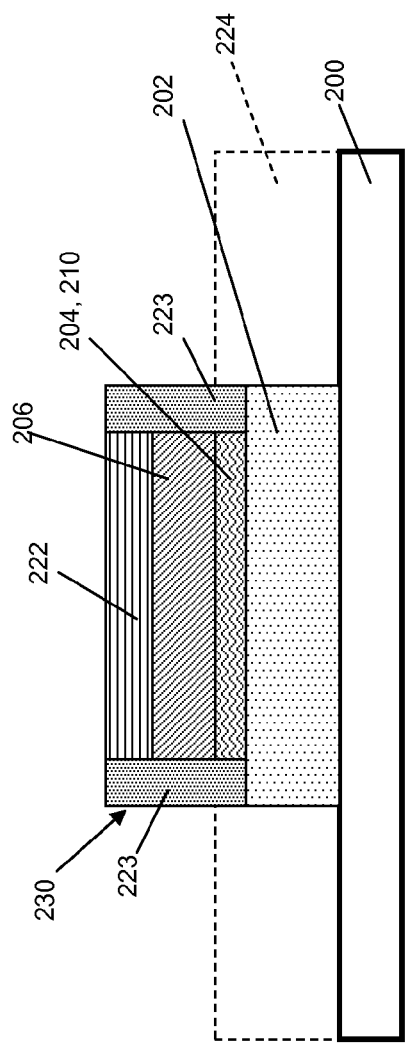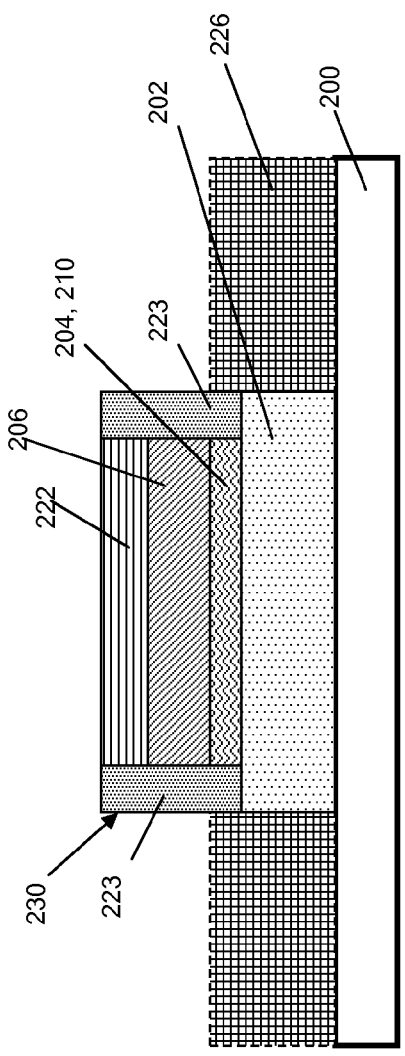

LOCALIZED IMPLANT INTO ACTIVE REGION FOR ENHANCED STRESS

BACKGROUND OF THE INVENTION

The subject matter disclosed herein relates to enhancing strain in an integrated circuit. Specifically, the subject matter disclosed herein relates to a structure and method for enhancing strain in an integrated circuit by using a localized implant into a gate region prior to gate etch.

The application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents). Typical methods for enhancing stress in an integrated circuit involve the use of a blanket implantation across an entire semiconductor substrate. For example, as shown in FIG. 1, semiconductor substrate 100 is provided, including a region defining a gate region 102. A thin gate layer 104 is then deposited across substrate 100. Substrate 100 is then blanket implanted, i.e., implanted across the entire surface of substrate 100, as illustrated by arrows 106. A thicker gate layer 108 (FIG. 2) is then deposited across substrate 100 and finally substrate 100 is annealed to create the desired stress.

BRIEF DESCRIPTION OF THE INVENTION

Methods for enhancing strain in an integrated circuit are provided. Embodiments of the invention include using a localized implant into an active region prior to a gate etch. In another embodiment, source/drain regions adjacent to the gates are recessed to allow the strain to expand to full potential. New source/drain regions are allowed to grow back to maximize stress in the active region.

A first aspect of the invention provides a method comprising: providing a semiconductor substrate having an active region defined therein; depositing a first gate layer on the semiconductor substrate; implanting a stress-inducing material only into the active region; depositing a second gate layer on the semiconductor substrate; and annealing the semiconductor substrate, creating a stress in the active region, wherein the implanting occurs prior to the annealing.

A second aspect of the invention provides a method comprising: providing a semiconductor substrate including an active region and a non-active region defined therein; depositing a first gate layer on the semiconductor substrate; implanting a stress-inducing material into the first gate layer; removing the first gate layer over the non-active region; depositing a second gate layer; and annealing the semiconductor substrate, wherein the implanting occurs prior to the annealing.

A third aspect of the invention provides a method comprising: providing a semiconductor substrate including an active region defined therein; forming a first gate layer on the semiconductor substrate having a stress-inducing material implanted therein only over the active region; depositing a second gate layer; annealing the semiconductor substrate; forming the first gate layer and the second gate layer into a gate structure; recessing a source/drain region in the semiconductor substrate adjacent to the active region, allowing stress in the active region to increase; and re-growing the source/drain region adjacent to the gate structure.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 3 and 4 show cross-sectional views of a method according to an embodiment of the invention.

FIGS. 6-8 show cross-sectional views of a method according to another embodiment of the invention.

FIGS. 9-11 show cross-sectional views of a process of the method according to embodiments of the invention.

FIG. 12 shows cross-sectional views of a process of the method according to another embodiment of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Methods for enhancing stress in an integrated circuit (IC) according to embodiments of this invention are disclosed.

Turning to FIGS. 3-4, a first embodiment of the invention is shown. In FIGS. 3-4, a semiconductor substrate 200 is provided having an active region 202 defined therein. Active region 202 may not be structurally defined other than being an area reserved for gates to be built on, or it may be doped with a particular dopant. Areas outside of active region 202 define non-active regions 203. Semiconductor substrate 200 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

FIG. 3 also shows depositing a first gate layer 204 on semiconductor substrate 200. First gate layer 204 may be relatively thin, e.g., approximately 5 nm to approximately 50 nm. First gate layer 204 may include any of the semiconductor materials listed for semiconductor substrate 200. As used herein, the term "depositing" or "deposition" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Figure 1:
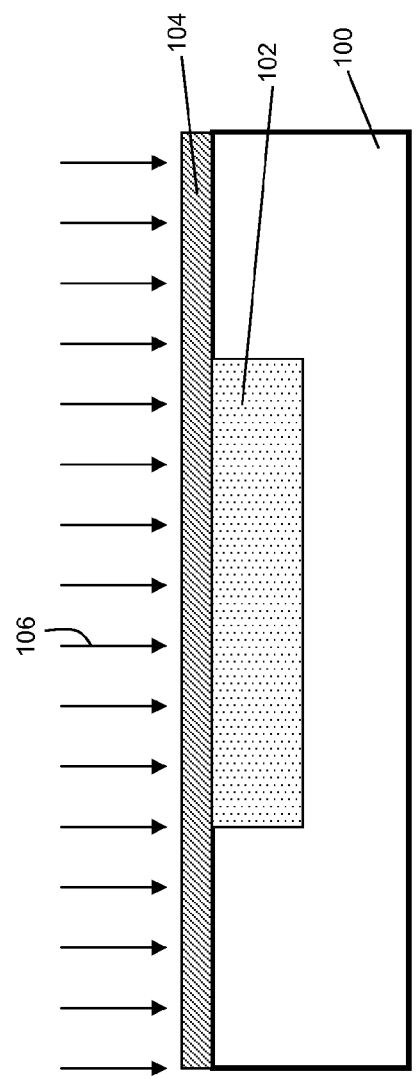
FIGS. 1 and 2 show cross-sectional views of a method and structure for enhancing strain in an IC as known in the art.
Figure 2:
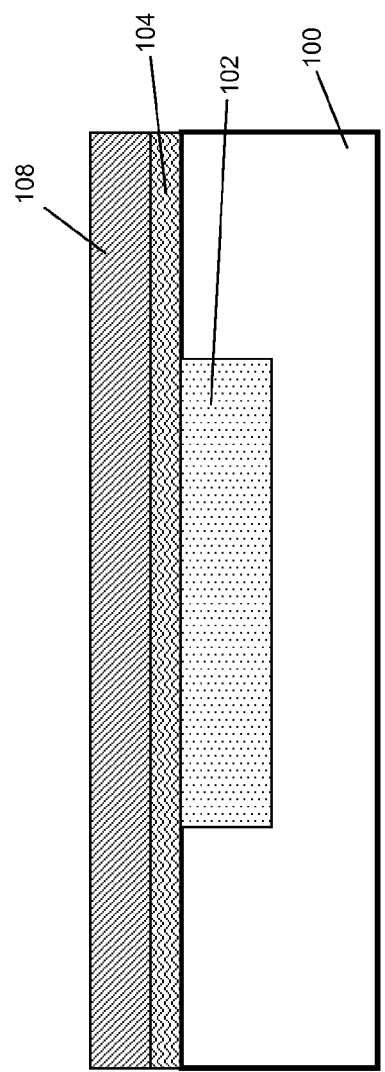
Figure 5:
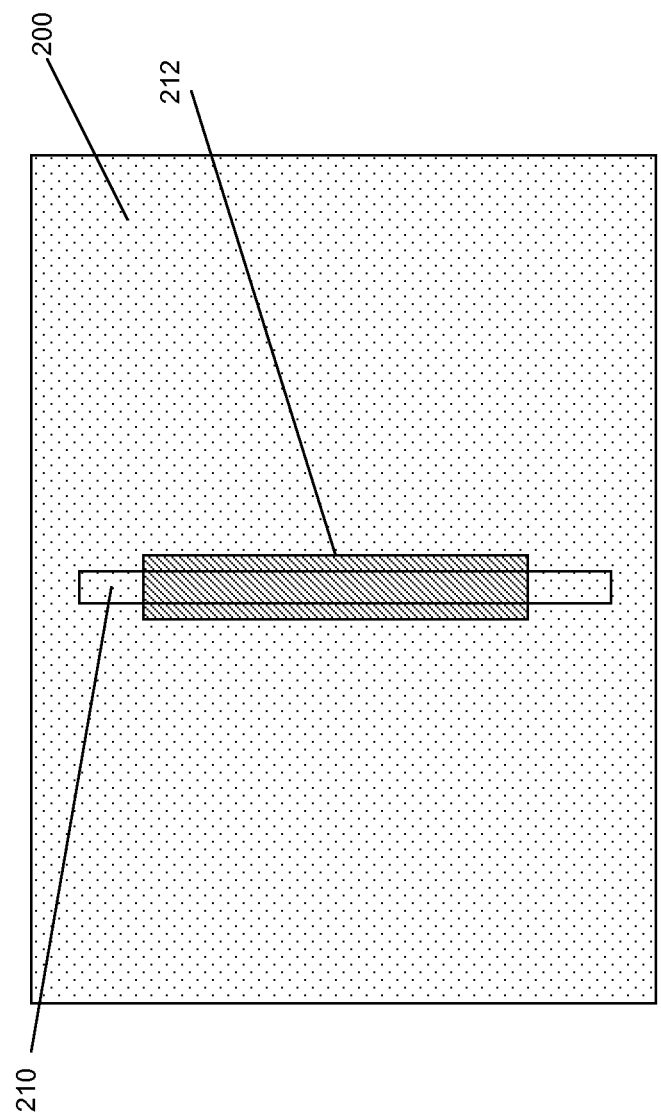
FIG. 5 shows a top view of the method of FIGS. 3-4.

According to embodiments of this invention, a localized implant, as illustrated by arrows 205 (FIG. 3), of a stress-inducing material only into first gate layer 204 and active region 202 is then performed. As shown in FIG. 3, implanting into first gate layer 104 results in a stress including gate layer 210. Localized implant 205 (FIG. 3) dosage can be less than the entire active region 202, as long as the active portions of active region 202 are included. For example, FIG. 5 shows a top view of substrate 200, illustrating an implanted region 212 that is doped less than a final gate region 210. Implanting 205 may employ any now known or later developed implanting technique, e.g., ion beam implanting, plasma ion implanting, etc., that generates an implanted species density in the range of approximately $2\times10^{20}$ to approximately $3\times10^{21}$ atoms/cm$^3$. Masks (not shown) may be employed where necessary. Stress-inducing material may be any appropriate material capable of creating the appropriate stress. For example, an N-type dopant in NFET or p-type dopant in PFET or neutral type implant (such as silicon).

In an alternative embodiment, shown in FIGS. 6-8, rather than performing localized implant 205 (FIG. 3) just in active region 202, an implant 220 (FIG. 6) is performed across first gate layer 204, i.e., across entire semiconductor substrate 200. Again, implanting 220 may employ any now known or later developed implanting technique, e.g., ion beam implanting, plasma ion implanting, etc., and generates an implanted species density in the range of approximately $2\times10^{20}$ to approximately $3\times10^{21}$ atoms/cm$^3$. Masks (not shown) may be employed where necessary. Then, as shown in FIG. 7, mask 208 can be placed over non-active regions 203 (FIG. 8) of semiconductor substrate 200 such that an etch process, as illustrated by arrows 207 (FIG. 7), can be performed to remove first gate layer 204 where not masked, i.e., over non-active region(s) 203. Consequently, the stress imparted by the dopants in first gate layer 204 is removed from non-active regions 203 (FIG. 8). As shown in FIG. 8, stress including gate layer 210 over only active region 202 is the result.

In either embodiment, as shown in FIGS. 9 and 10, a second gate layer 206 is deposited on semiconductor substrate 200. FIG. 9 shows the FIGS. 3-4 embodiment, while FIG. 10 shows the FIG. 8 embodiment. Second gate layer 206 can range in thickness from approximately 5 nm to approximately 75 nm. As also shown in FIGS. 9 and 10, semiconductor substrate 200 is then annealed 221 to create a stress in active region 202. The implanting of FIGS. 3 and 6 occurs prior to the annealing of FIGS. 9 and 10.

FIG. 11 shows forming first gate layer 204 and second gate layer 206 into a gate structure 230 after second gate layer 206 is deposited. Gate structure 230 forming, however, can occur prior to annealing (FIGS. 9 and 10) or after annealing. Gate structure 230 may be formed using any now known or later developed techniques, for example, depositing a cap layer 222, patterning a mask (not shown), etching gate layers 204, 206 and cap layer 222 and forming a spacer(s) 223. Gate structure 230 thus includes spacer(s) 220 about first gate layer 204 and second gate layer 206, and a cap 222 above second gate layer 206.

A second embodiment according to aspects of this invention is shown in FIGS. 11-12. As FIG. 11 illustrates, the steps discussed with respect to the above-described embodiments have been performed such that substrate 200 includes gate layer 204 (stress including gate layer 210) and gate layer 206 just over active region 202. According to this embodiment, as shown in FIG. 11, after substrate 200 has been annealed, spacers 223 and a cap 222 are used to recess and/or remove source/drain regions 224 (shown in phantom) adjacent to gate structure 230 to allow the stress in active region 202 to increase. Then, as shown in FIG. 12, a new source/drain region 226 is epitaxially re-grown adjacent to gate structure 230 to maximize stress in active region 202.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   providing a semiconductor substrate having a gate region and a non-active region defined therein;
   depositing a first gate layer on the semiconductor substrate, the first gate layer substantially covering the gate region and the non-active region;
   implanting a stress-inducing material into only the gate region and portions of the first gate layer on the gate region following the depositing the first gate layer, wherein the implanting forms a stress including gate layer substantially on the gate region;
   depositing a second gate layer on the semiconductor substrate after the implanting the stress-inducing material;
   annealing the semiconductor substrate after the depositing of the second gate layer, wherein the annealing creates a stress in the gate region; and
   forming a gate structure including a gate electrode, the gate structure formed directly above the gate region and including the first gate layer and the second gate layer, wherein the forming the gate structure includes etching the first gate layer and the second gate layer after the implanting the stress-inducing material.

2. The method of claim 1, further comprising forming the first gate layer and the second gate layer into the gate structure after the second gate layer depositing,
   wherein the gate structure is formed adjacent a source/drain region on the semiconductor substrate and the second gate layer has a thickness of about 5 nanometers to about 75 nanometers.

3. The method of claim 2, further comprising:
   depositing a cap layer on the second gate layer in the gate region;
   recessing the source/drain region in the semiconductor substrate adjacent to the gate region, allowing stress in the gate region to increase;
   forming a set of spacers around the gate region; and
   re-growing the source/drain region adjacent to the gate structure.

4. The method of claim 1, wherein the gate region is disposed adjacent a source/drain and the first gate layer has a thickness of about 5 nanometers to about 50 nanometers.

5. The method of claim 1, wherein the annealing of the semiconductor substrate includes annealing the second gate layer after the depositing.

6. The method of claim 4, further comprising:
   recessing the source/drain region in the semiconductor substrate adjacent to the gate region, allowing stress in the gate region to increase; and
   re-growing the source/drain region adjacent to the gate structure.

7. The method of claim 1, wherein the implanting includes a dose in the range of approximately $2 \times 10^{20}$ atoms/cm$^3$ to approximately $3 \times 10^{21}$ atoms/cm$^3$ and is performed in less than the entire gate region.

8. The method of claim 1, wherein the stress-inducing material is only implanted into active portions of the gate region and portions of the first gate layer above the active portions of the gate region.

* * * * *